United States Patent [19]
Kirchhoff et al.

[11] Patent Number: 6,057,250
[45] Date of Patent: May 2, 2000

[54] LOW TEMPERATURE REFLOW DIELECTRIC-FLUORINATED BPSG

[75] Inventors: Markus Kirchhoff, Ottendorf-Okrilla, Germany; Ashima Chakravarti, Hopewell Junction, N.Y.; Matthias Ilg, Richmond, Va.; Kevin A. McKinley, Fremont; Son V. Nguyen, Los Gatos, both of Calif.; Michael J. Shapiro, Austin, Tex.

[73] Assignees: International Business Machines Corporation, Armonk, N.Y.; Sienens Aktiengesellschaft, Munich, Germany; LAM Research Corporation, Freemont, Calif.

[21] Appl. No.: 09/014,431

[22] Filed: Jan. 27, 1998

[51] Int. Cl.[7] .................. H01L 21/31; H01L 21/469; H01L 21/225

[52] U.S. Cl. ................ 438/784; 438/790; 427/99; 427/255.1; 427/255.2; 427/255.3

[58] Field of Search .................. 438/784, 790; 427/99, 255.1, 255.2, 255.3

[56] References Cited

U.S. PATENT DOCUMENTS

| | | |
|---|---|---|
| 4,791,005 | 12/1988 | Becker et al. . |
| 4,845,054 | 7/1989 | Mitchener . |
| 5,094,984 | 3/1992 | Liu et al. . |
| 5,104,482 | 4/1992 | Monkowski et al. . |
| 5,166,101 | 11/1992 | Lee et al. . |
| 5,180,692 | 1/1993 | Ibuka et al. . |
| 5,286,681 | 2/1994 | Maeda et al. . |
| 5,354,387 | 10/1994 | Lee et al. . |
| 5,571,576 | 11/1996 | Qian ........................................ 427/574 |

FOREIGN PATENT DOCUMENTS 0 562 625 A2    9/1993    United Kingdom .

*Primary Examiner*—Charles Bowers
*Assistant Examiner*—Nema Berezny
*Attorney, Agent, or Firm*—DeLio & Peterson LLC; John J. Tomaszewski; Steven Capella

[57] ABSTRACT

An apparatus and method are provided for forming a fluorine doped borophosphosilicate (F-BPSG) glass on a semiconductor device using a low pressure chemical vapor deposition process. The F-BPSG glass exhibits a substantially void-free and particle-free layer on the substrate for structures having gaps as narrow as 0.10 microns and with aspect ratios of 6:1. The reactant gases include sources of boron and phosphorous dopants, oxygen and a mixture of TEOS and FTES. Using a mixture of TEOS and FTES in a low pressure CVD process provides a F-BPSG layer having the above enhanced characteristics. It is a preferred method of the invention to perform the deposition at a temperature of about 750–850° C. and a pressure of 1 to 3 torr to provide for in situ reflow of the F-BPSG during the deposition process. An anneal is also preferred under similar conditions in the same chemical vapor deposition chamber to further planarize the F-BPSG surface. A F-BPSG glass and semiconductor wafers having a layer of fluorine doped BPSG thereon formed by the method and apparatus of the invention are also provided.

7 Claims, 2 Drawing Sheets

LOW TEMPERATURE REFLOW DIELECTRIC-FLUORINATED BPSG

BACKGROUND OF THE INVENTION

1. Field of the Invention

The present invention relates to semiconductor electronic components and to a method for fabricating such components and, more particularly, to an improved boron phosphorous silicate glass used as a layer on the semiconductor wafer which layer is substantially void-free for structures as narrow as 0.10 micron and with aspect ratios up to 6:1 and a method for forming the glass layer which includes a reflow temperature of about 750° C. which temperature is lower than present and proposed fabrication requirements.

2. Description of Related Art

In the manufacture of semiconductor electronic components, it is necessary to encapsulate the component in a glass or to use a glass as an interlayer dielectric film. Typically, the glass layer is an $SiO_2$ layer which is formed on the surface of the wafer using chemical vapor deposition (CVD). As the result of increasing demands of industry, the need for finer circuitry patterns and increased circuit density has made it necessary to develop improved glass layers for layering the semiconductor surfaces during the fabrication process. Of particular concern is the unevenness of the semiconductor substrate surface which becomes more critical as the circuit density and highly precise circuit patterns become finer.

In the early stages of forming glass layers on semiconductor wafers, an $SiO_2$ layer was used as the glass material. These oxide glass layers were improved by the addition of dopants such as boron and/or phosphorous to the glass which dopants lowered the melting temperature and permitted the layers to be reheated to soften the glass and cause it to reflow to create a planar surface on the semiconductor device. As the circuit density and the need for fine circuit patterns have increased, however, it has been recognized that it is important to formulate and process oxide glass films to fill even smaller gaps on the surface of the semiconductor device without voids or bubbles within the oxide glass layer.

A borophosphosilicate glass (BPSG) is now used as an interlevel dielectric layer and has to provide a void-free fill of structures as narrow as 0.10 micron with aspect ratios up to 6:1. To fulfill this requirement, the BPSG layer is typically reflowed after deposition in the range of its glass transition temperature which is around 800–850° C. The glass transition temperature is an important property of the glass and it is highly desirable that the reflow temperature be as low as possible for process effectiveness and to avoid temperature damaging effects to the semiconductor wafer during the fabrication process.

Boron and phosphorous doped silicon oxide layers (BPSG) are typically manufactured by reacting in a carrier gas and in the gaseous phase, tetraethylorthosilicate (TEOS), trimethylphosphate (TMP) or phosphine ($PH_3$) and trimethylborate (TMB) or triethylborate (TEB) in the presence of oxygen and preferably with a small amount of ozone. The process can be carried out both in a plasma arc process, or at atmospheric pressure with ozone (at 350–600° C.) or using a reduced pressure process at higher temperatures (e.g., 700–850° C.). Typically, higher pressure processes use a low temperature process such as the deposition of BPSG by the co-oxidation of the reactants at temperatures of 400–600° C. at a pressure of 50–760 torr (with ozone) and a temperature of 350–480° C. at a pressure of 1–10 torr. Alternatively, a high temperature deposition process may be employed which uses low pressures such as about 0.5 to 5 torr and which process is performed in the temperature range of about 700–850° C.

Broadly stated, it is highly desirable that the viscosity of the BPSG be low during the fabrication process to provide a void-free fill of structures as narrow as 0.10 micron with aspect ratios up to 6:1. The viscosity of the BPSG can be decreased by increasing the reflow temperature which is the temperature at which the deposited glass starts to flow and which is also commonly termed the glass transition temperature. The viscosity can also be decreased by increasing the dopant concentration of boron and phosphorous in the BPSG. In addition, the fill behavior of the glass is a function of the surface tension. F-doping increases the surface tension and decreases the viscosity both enhancing fill characteristics at lower temperatures.

The thermal budget for semiconductor devices, however, is limited to around 800° C. for 30 minutes. Hence, an increase of reflow temperature is not desirable for many fabrication applications. Likewise, the dopant concentration is limited to around 5 weight percent each for $B_2O_3$ and $P_2O_5$ since exceeding this concentration results in surface crystal growth of boric acid or boric phosphate after deposition. Surface crystals are not desirable due to fabrication and integration problems with subsequent lithography, reactive ion etching (RIE) and chemical mechanical polishing (CMP) processes.

A number of patents have issued in this area to address improving BPSG films. U.S. Pat. Nos. 4,791,005; 4,845,054; 5,094,984; 5,104,482; 5,180,692; 5,286,681; and 5,354,387 show methods for making BPSG films on semiconductor substrates.

In European Publication No. 0562625, it is disclosed that oxygen atoms of the BPSG film may be replaced by non-bridging constituents such as atoms of halogen including fluorine. This breaks an oxygen bridge between the silicon atoms, and results in a lowering of the viscosity of the dielectric film. Exemplary is the replacement of part of the oxygen in a BPSG film with fluorine to lower the dielectric film flow temperature to about 850° C.

Bearing in mind the problems and deficiencies of the prior art, it is therefore an object of the present invention to provide an improved method for forming a borophosphosilicate glass on a substrate such as a semiconductor wafer which glass has improved gap-fill properties and a low reflow temperature.

It is another object of the present invention to provide a substrate such as a semiconductor wafer having a layer of a borophosphosilicate glass thereon which glass has improved gap-fill properties and a low reflow temperature.

A further object of the invention is to provide a borophosphosilicate glass with enhanced gap fill capability to provide a void-free fill of structures as narrow as 0.10 micron with aspect ratios of 6:1.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed, in a first aspect, to a method of forming an enhanced fluorine doped borophosphosilicate glass (F-BPSG) on a substrate such as a semiconductor wafer in a low pressure chemical vapor deposition chamber comprising the steps of:

mixing and reacting in a low pressure chemical vapor deposition chamber gaseous sources of TEOS, a fluorine containing alkoxy silane such as FTES (fluorotriethoxysilane), boron and phosphorous dopants such as TEB or TMB and $PH_3$ and an oxygen source at a temperature of about 650 to 850° C., preferably 720 to 780° C. and a pressure of about 0.5 to 5 torr preferably 1 to 3 torr;

depositing a layer of fluorine doped BPSG on a semiconductor substrate disposed in the chamber; and reflowing the layered semiconductor device at a temperature below about 800° C., preferably about 750° C. for an effective time such as 10 to 20 minutes to planarize the deposited layer.

In a preferred aspect of the invention, the method employs a gaseous mixture of the fluorine source and TEOS in a weight ratio of fluorine source to TEOS of about 0.25:1 to 3:1 preferably about 0.5:1 to 2:1. In another preferred embodiment, the reaction temperature is about 720 to 780° C. and reaction pressure is about 1 to 3 torr.

The preferred method of forming a fluorine doped BPSG layer on a semiconductor device is in an apparatus comprising a circular reaction chamber in which a plurality of devices are disposed horizontally and are equally spaced in the chamber and rotate in the chamber in which the gaseous reactants are reacted. In a highly preferred aspect of the invention, an alternating segmented gas flow procedure is employed wherein a gaseous mixture of the boron component (e.g., TEB), TEOS, oxygen source (e.g., $O_2$), carrier gas (e.g., $N_2$) and fluorine source (e.g., FTES) is mixed and fed into alternate inlet ports at the periphery of the reactor with a gaseous mixture containing the phosphorous dopant component (e.g., $PH_3$), oxygen source (e.g., $O_2$) and carrier gas (e.g., $N_2$) being fed into the other alternate inlet ports.

In a further aspect of the invention, an apparatus is provided for forming an enhanced fluorine doped borophosphosilicate glass on a substrate such as a semiconductor wafer comprising:

a low pressure circular chemical vapor deposition chamber having gas inlet means and support means to support the substrate in the chamber and preferably means to rotate the substrate support;

means for feeding gaseous sources of tetraethylorthosilicate, a fluorine containing alkoxy silane, boron and phosphorus dopants and an oxygen source to the inlet means; and wherein the gases react in the chamber and deposit a layer of fluorine doped borophosphosilicate glass on the substrate.

In another aspect of the invention, a semiconductor wafer having a layer of fluorine doped BPSG (F-BPSG) thereon is formed by using the method and apparatus of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
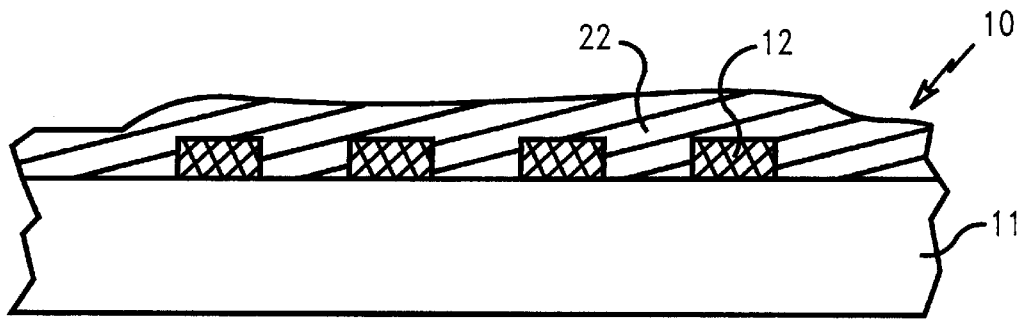
FIG. 1 is a side elevational cross-sectional view of a semiconductor device layered with a BPSG film of the invention.

In describing the preferred embodiments of the present invention, reference will be made herein to FIGS. 1–4 of the drawings in which like numerals refer to like features of the invention. Features of the invention are not necessarily shown to scale in the drawings.

In accordance with the invention, a fluorine containing BPSG insulating and planarizing layer (hereinafter termed F-BPSG) is formed on surfaces of a semiconductor wafer and other electronic component substrates. The F-BPSG layer is characterized by a substantial absence of voids and surface crystals and is a glass layer which may be readily reflowed at relatively low reflow temperatures consistent with present and proposed semiconductor wafer fabrication procedures.

Use of the term "semiconductor wafer" herein is meant to include structures on the surface of the wafer such as raised lines, trenches and devices such as transistors. The structures on the surface of the semiconductor wafer form what are commonly termed "stepped surfaces" to indicate a configuration in which the structures on the surface form trenches between the structures including high aspect ratio trenches, i.e., trenches with depth to width ratios greater than 1, e.g., 4:1 or even 6:1. It will be understood by those skilled in the art that the surface of the substrate to be layered may also contain openings therein such as channels (or trenches) which also are filled by the deposited glass layer.

Figure 2:
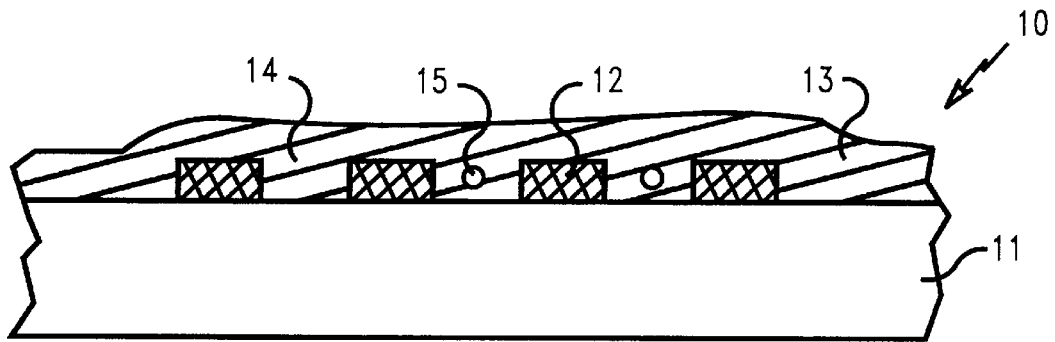
FIG. 2 is a side elevational cross-sectional view of a semiconductor device layered with a void containing BPSG film of the prior art.
Figure 3:
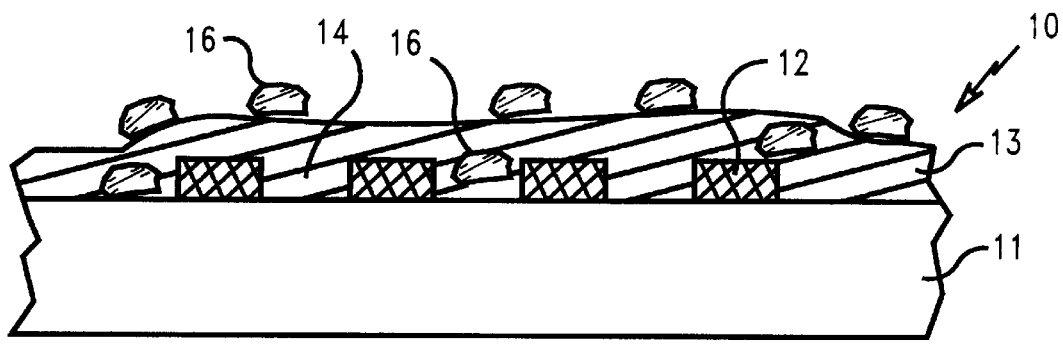
FIG. 3 is side elevational cross-sectional view of a semiconductor device layered with a surface crystal containing BPSG film of the prior art.

Referring first to FIGS. 2 and 3, commercially unacceptable integrated circuit structures of the prior art are shown having BPSG layers thereon containing voids and/or surface crystals. Thus, in FIG. 2, a semiconductor device shown generally as 10 comprises a substrate 11 such as a silicon wafer having on the surface thereof a plurality of raised lines 12. The raised lines form a series of channels or trenches 14 between the raised lines 12 which channels must be filled completely with the BPSG layer without any significant amount of voids or surface particles. A layer of BPSG conventionally applied and reflowed is shown as 13 and has a number of voids 15 therein in the trenches 14. Similarly, in FIG. 3, surface crystals 16 are shown at the surface of the BPSG layer 13 as well as in the trenches 14 of the BPSG layer.

FIGS. 2 and 3 are to be compared with FIG. 1 which is a glass layered semiconductor wafer made according to the method of the invention. Thus, a semiconductor substrate 11 having a series of raised lines 12 thereon was coated with a layer of F-BPSG 22 using the method of the invention. There are no significant amount of voids or surface crystals in the layer which would make the wafer commercially unacceptable and it is this type of glass layered electronic component which is desired by the electronic fabrication industry.

The F-BPSG film layer of the invention is made in a low pressure chemical vapor deposition (LP-CVD) chamber which chambers are well-known in the art. In a preferred embodiment, the reaction chamber is circular and rotates horizontally about a central vertical axis with a plurality of silicon wafers positioned on a horizontal circular platen. The process gases are injected into the chamber, preferably into a series of inlet ports positioned around the periphery of the chamber. In a preferred aspect of the invention, two sets of reaction gases are employed with each set of gas being alternately injected into the reaction chamber through the series of inlet ports. This will be further discussed hereinbelow with reference to FIG. 4.

Broadly stated, the reactants are gaseous sources of phosphorous and boron dopants and tetraethylorthosilicate (TEOS) and a fluorine containing alkoxysilane, preferably an ethoxysilane (FTES refers to fluorotriethoxysilane and will be used to generally describe the fluoroalkoxy silane source). Ethoxysilane may also be substituted with two fluorine atoms to form difluorodiethoxysilane. For convenience, the following description will be directed to FTES although other fluoroalkoxy silanes such as fluoroethoxysilanes are contemplated herein and may be employed in the process. The alkoxy group is preferably a lower alkoxy and is typically ethoxy. The gaseous reactants will also include a gaseous source of oxygen which includes ozone and oxygen/ozone mixtures and hydrogen peroxide. A carrier gas such a argon, nitrogen, or helium is also typically present in the mixture of gases and is preferred from a process operating standpoint.

The gaseous sources of boron and phosphorous may comprise any gases respectively containing boron or phosphorous. The boron and phosphorous sources may contain any other materials which will not interfere with the F-BPSG deposition and which are capable of decomposing and reacting with both the TEOS and FTES and the oxygen and/or ozone at the specified pressure and temperature ranges of the process. Preferably, such gaseous sources of boron and phosphorous will be organic boron-containing and phosphorous-containing gases which will decompose at the deposition temperature with the remainder of the components of the gases volatilizing and being removed by the vacuum pumping system used to maintain the vacuum in the reaction chamber.

Examples of such gaseous sources of boron and phosphorous include triethylborate (TEB), trimethylborate (TMB), phosphine, triethylphosphate (TEP), and the like and mixtures thereof. Preferred gaseous sources of boron and phosphorous are TEB and phosphine because of their demonstrated effectiveness.

It is an important feature of the invention that a mixture of TEOS and FTES be employed in a low pressure chemical vapor deposition (LPCVD) reaction chamber to achieve the enhanced F-BPSG film layers of the invention. The weight ratio of FTES to TEOS may vary widely and is preferably between about 0.25:1 to 3:1 and more preferably about 0.5:1 to 2:1, e.g., 0.5:1 to 1:1.

The gaseous reactant sources are typically mixed with a suitable non-reactive carrier gas such as nitrogen, argon or helium using a liquid injection system well-known in the art. Generally, a liquid injection system utilizes individual pumps to pump a liquid reactant to a cavity where it is volatilized and then the vapor fed into the reaction chamber. Thus, if more than one liquid is to be fed as a gaseous mixture to the reaction chamber, each liquid is pumped to the same cavity and volatilized and then injected as a gaseous mixture.

The gaseous reactants and/or vaporized liquid reactants may be mixed singularly with each of the inert carrier gases and injected separately into the reaction chamber. A preferred method is to combine the gaseous sources of boron and phosphorous dopants with a suitable non-reactive carrier gas as one injection stream and the TEOS and FTES as another gaseous injection stream. The oxygen and/or ozone reactant may be mixed with either or both of said streams.

In a highly preferred embodiment of the invention because of its demonstrated effectiveness, two gaseous source injection streams are formed. One injection stream contains phosphine (or other phosphorous source), oxygen and/or ozone and a carrier gas such as nitrogen. The other reactant stream contains the boron source such as TEB, TEOS, FTES, oxygen and/or ozone and a carrier gas such as nitrogen. The above liquid injection system would be used as described above.

Figure 4:
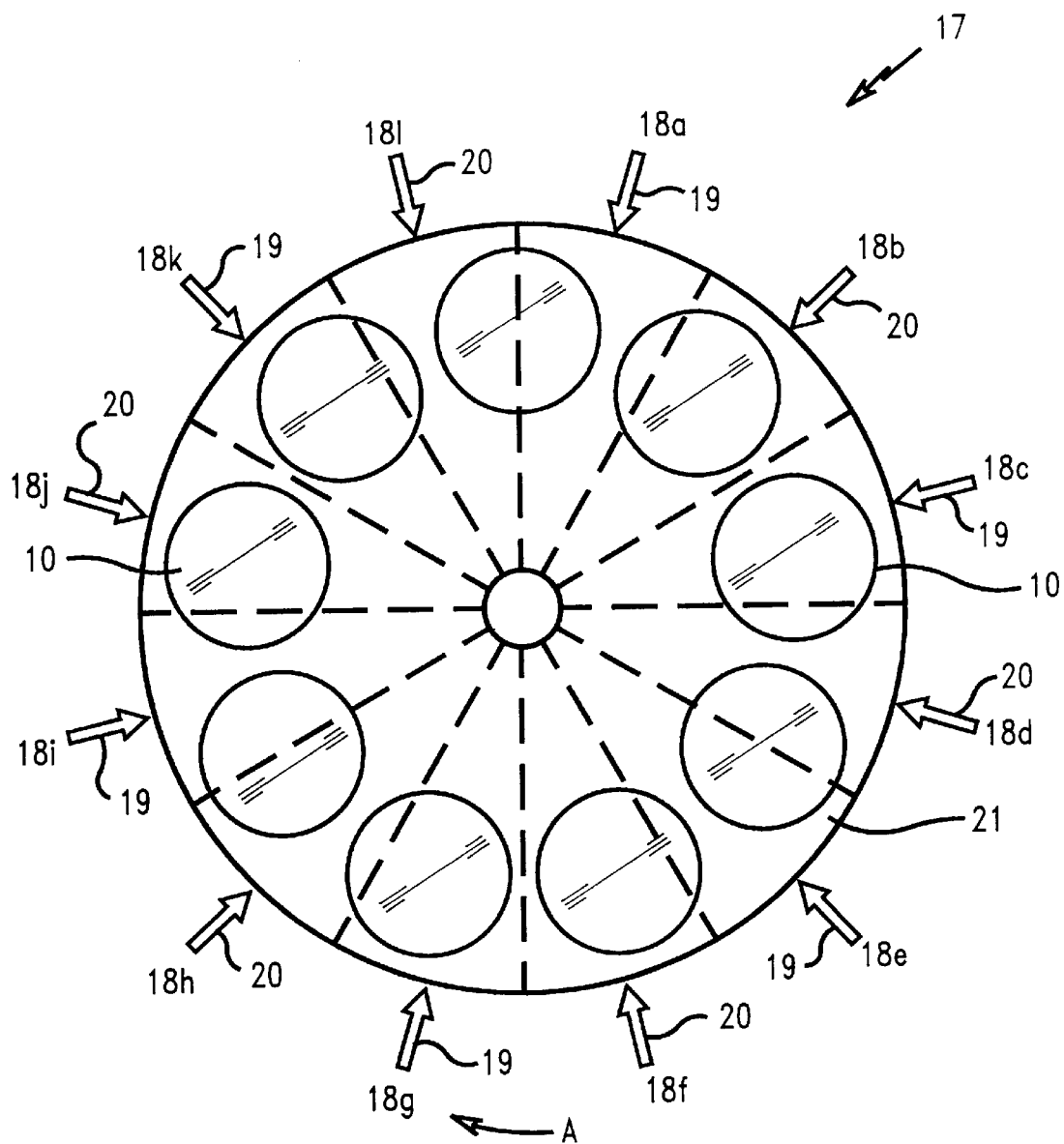
FIG. 4 is a top diagrammatic view of a reaction chamber apparatus of the invention used to deposit a BPSG film on a plurality of semiconductor wafer substrates.

A preferred vacuum chamber apparatus used with the invention comprises a circular apparatus wherein the wafers are positioned on a rotating horizontal circular platen around the periphery of the platen. The apparatus is shown preferably segmented as in FIG. 4 and contains a series of input injection ports and each of the above preferred gas streams is injected alternately around the periphery of the vacuum chamber. Thus, as shown in FIG. 4, the reaction chamber shown diagramatically as 17 has nine wafers 10 equally positioned around the periphery of the chamber on platen 21. A number of input ports designated 18a–18l are shown at the periphery of the reaction chamber. A gaseous source 19 comprising TEB/TEOS/FTES/O2/N2 prepared using a liquid injection system as described above is introduced at alternating input ports 18a, 18c, 18e, 18g, 18i and 18k. A phosphorous containing stream 20 containing phosphine/O2/N2 is shown being fed into inlet ports 18b, 18d, 18f, 18h, 18j and 18l. The reaction chamber 17 is rotated during the deposition process as shown by the direction of arrow A.

The method of the invention comprises employing a low pressure chemical vapor deposition (LPCVD) process and a mixture of TEOS and FTES reactants as silicon sources. Broadly stated, the reaction and deposition of the F-BPSG layer is performed at deposition temperatures of about 650° C.–850° C. at a pressure of about 0.5–5 torr. In a preferred embodiment, a deposition temperature of about 750° C.–850° C. is employed which provides an in situ reflow of the deposited F-BPSG layer during the deposition process. Due to this in situ reflow, wafer openings with high aspect ratios and small gaps, e.g., less than 0.10 micron, can be filled using the same deposition/anneal temperature and the same boron and phosphorous dopant concentrations. Regardless of the deposition conditions used, the deposition may be, and typically is, followed by an anneal at 750° C.–850° C. for 20 minutes, preferably less than 800° C., e.g., 750° C., in the same LPCVD system in which the deposition was performed. This provides increased operating efficiencies and cost reduction for the manufacturing process. The anneal is typically performed at a low pressure of 0.5–5 torr, e.g., such as 1 to 3 torr.

It has been found in comparative examples forming a conventional BPSG film and a F-BPSG film of the invention at the same deposition temperature and same anneal temperature and with the same boron and phosphorous dopant concentrations, that the F-BPSG film of the invention provided a void-free fill whereas the BPSG deposition had a number of voids and was commercially unacceptable.

The total flow of the gaseous reactants into the deposition chamber to obtain the highest deposition rates will vary somewhat with the design and geometry of the particular apparatus utilized for the deposition process. In general, the flow rates of the reactants will be employed to provide a F-BPSG film having a composition of, by weight %, about 2 to 5% boron, 2 to 5% phosphorous. The concentration of fluorine in the F-BPSG is about, by weight, 1 ppm to 1%.

The following example is provided to describe the invention is not intended to limit the invention.

EXAMPLE

Using a DSM9800 system made by Lam Research, a total of 9 eight inch wafers were processed simultaneously. Gases were injected through the 12 input injector ports as shown in FIG. 4 alternating a TEB/FTES/TEOS/O2/N2 mixture prepared using a liquid injection system and a $PH_3$/O2/N2 gas mixture. The liquids were supplied at a rate of about 10 ml/min (total liquids). The $PH_3$ was about 1 standard liter per minute (slpm), the $O_2$ about 2 slpm and the $N_2$ about 3 slpm.

The platen holding the wafers rotated during the deposition at a rate from 1 to 10 rpm. The pressure of the system was 2.9 torr and the deposition temperature was 750° C. Deposition was stopped after 5 minutes. An anneal at 750° C. was performed for 20 minutes in the same reactor at 2.9 torr.

The deposited wafers had a composition, by weight, about 4.5% P, about 4.5% B and about 0.1% F. The deposited wafer exhibited a planar surface without any significant amount of voids or surface particles. The wafer was characterized by having a series of 64 mega byte devices thereon providing a 0.15 micron gap between the devices and aspect ratios of about 4:1.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is: We claim:

1. A method of forming a fluorine doped borophosphosilicate glass (F-BPSG) on a semiconductor wafer in a low pressure chemical vapor deposition chamber comprising the steps of:

mixing and reacting in a low pressure chemical vapor deposition chamber gaseous sources of TEOS, fluoroalkoxy silane, boron and phosphorous dopants and an oxygen source at a temperature of about 650 to 850° C. and a pressure of about 0.5 to 5 torr;

depositing a layer of fluorine doped BPSG on a semiconductor substrate disposed in the chamber; and reflowing the layered F-BPSG on the semiconductor substrate at a temperature below about 800° C. for an effective time to planarize the deposited layer.

2. The method of claim 1 wherein the fluoroalkoxy silane and tetraethylorthosilicate are in a weight ratio of about 0.25:1 to 3:1.

3. The method of claim 2 wherein the fluoroalkoxy silane is a fluorotriethoxysilane.

4. The method of claim 3 wherein the reaction temperature is about 720° C. to 780° C. and the pressure is about 1 to 3 torr.

5. The method of claim 4 wherein the boron source is triethylborate or trimethyborate and the phosphorous source is phosphine.

6. The method of claim 1 wherein two separate gaseous injection streams are mixed and reacted, the first stream containing the phosphorous source, oxygen and a carrier gas and the second stream containing the boron source, tetraethylorthosilicate, the fluorine containing alkoxy silane, oxygen and a carrier gas.

7. The method of claim 6 wherein the boron source is triethyl or trimethyl borate and the phosphorous source is phosphine.

* * * * *